(12) United States Patent
Sekine

(10) Patent No.: US 10,741,606 B2
(45) Date of Patent: Aug. 11, 2020

(54) IMAGE SENSOR AND SENSOR DEVICE

(71) Applicant: Tianma Japan, Ltd., Kawasaki, Kanagawa (JP)

(72) Inventor: Hiroyuki Sekine, Kawasaki (JP)

(73) Assignee: TIANMA MICROELECTRONICS CO., LTD., Shenzhen (CN)

(*) Notice: Subject to any disclaimer, the term of this patent is extended or adjusted under 35 U.S.C. 154(b) by 177 days.

(21) Appl. No.: 15/938,008

(22) Filed: Mar. 28, 2018

(65) Prior Publication Data
US 2018/0315792 A1 Nov. 1, 2018

(30) Foreign Application Priority Data
Apr. 28, 2017 (JP) ................. 2017-090592

(51) Int. Cl.
| | |
|---|---|
| H01L 27/146 | (2006.01) |
| H01L 29/786 | (2006.01) |
| G01T 1/24 | (2006.01) |
| H01L 31/0216 | (2014.01) |
| H01L 29/45 | (2006.01) |

(Continued)

(52) U.S. Cl.
CPC ........ *H01L 27/14663* (2013.01); *G01T 1/241* (2013.01); *H01L 27/124* (2013.01); *H01L 27/1225* (2013.01); *H01L 27/14614* (2013.01); *H01L 27/14636* (2013.01); *H01L 27/3258* (2013.01); *H01L 29/45* (2013.01); *H01L 29/7869* (2013.01); *H01L 29/78648* (2013.01);

(Continued)

(58) Field of Classification Search
CPC .......... H01L 27/14663; H01L 27/1225; H01L 27/124; H01L 27/14614; H01L 27/3258; H01L 27/14612; G01T 1/241
See application file for complete search history.

(56) References Cited

U.S. PATENT DOCUMENTS

| | | | |
|---|---|---|---|
| 5,408,113 A | 4/1995 | Kanno et al. | |
| 2007/0161165 A1* | 7/2007 | Liu | H01L 29/66757 438/151 |

(Continued)

FOREIGN PATENT DOCUMENTS

| | | |
|---|---|---|
| JP | 02-180071 A | 7/1990 |
| JP | 6-125422 A | 5/1994 |

(Continued)

*Primary Examiner* — David P Porta
*Assistant Examiner* — Jeremy S Valentiner
(74) *Attorney, Agent, or Firm* — Sughrue Mion, PLLC

(57) ABSTRACT

An image sensor includes a plurality of pixels arranged in matrix, and each pixel includes a first TFT having a first gate electrode and a second gate electrode that are arranged on a substrate, a second TFT, and a photoelectric conversion element that has a first electrode electrically connected to a first surface of an a-Si thin film and the second gate electrode of the first TFT and a second electrode connected to a second control line, and that is arranged above the first TFT so as to be superposed on the first TFT in an laminated direction. Provided is a gas barrier film that is positioned between the first and the second TFTs and the photoelectric conversion element and that prevents hydrogen from permeating into the first and the second TFTs, the first electrode and the second gate electrode are constructed by the same layer, and the gas barrier film is not provided with an aperture in each of the pixels.

12 Claims, 21 Drawing Sheets

(51) Int. Cl.
  *H01L 27/12*   (2006.01)
  *H01L 31/115*  (2006.01)
  *H01L 31/0376* (2006.01)
  *H01L 27/32*   (2006.01)

(52) U.S. Cl.
  CPC .. *H01L 31/02161* (2013.01); *H01L 31/03762* (2013.01); *H01L 31/115* (2013.01)

(56) References Cited

U.S. PATENT DOCUMENTS

| | | | |
|---|---|---|---|
| 2010/0244029 A1* | 9/2010 | Yamazaki | H01L 29/7869 257/52 |
| 2011/0198484 A1 | 8/2011 | Kurokawa | |
| 2015/0123119 A1 | 5/2015 | Sekine et al. | |
| 2016/0013243 A1* | 1/2016 | O'Rourke | H01L 27/14603 257/43 |
| 2016/0240561 A1* | 8/2016 | Saito | H01L 27/1225 |

FOREIGN PATENT DOCUMENTS

| | | |
|---|---|---|
| JP | 2009-147056 A | 7/2009 |
| JP | 2011-211171 A | 10/2011 |
| JP | 2015-090957 A | 5/2015 |
| JP | 2015-170859 A | 9/2015 |

\* cited by examiner

IMAGE SENSOR AND SENSOR DEVICE

This non-provisional application claims priority under 35 U.S.C. § 119(a) on Patent Application No. 2017-090592 filed in Japan on Apr. 28, 2017, the entire contents of which are hereby incorporated by reference.

FIELD

The present disclosure relates to an image sensor and a sensor device including the image sensor.

BACKGROUND

In recent years, X-ray imaging apparatus for performing circulatory organ fluoroscopic radiography have widely been used. The circulatory organ fluoroscopic radiography is performed by inserting a catheter into the blood vessels and photographing the course of the blood vessels with contrast medium. Out of such X-ray imaging apparatuses, the apparatuses intended for contrast imaging of cardiovascular vessels that especially move fast strongly need photographing at a high frame rate and high resolution. The sensor device used for the X-ray photographing apparatus is an X-ray image sensor employing an image intensifier (I.I.) or an amorphous silicon (a-Si) thin film transistor (TFT). The I.I. has low spatial resolution due to its structure, which makes it difficult to provide high resolution. The X-ray image sensor employing an a-Si TFT has a problem of being unable to be operated at a high frame rate due to its low current driving capability of the a-Si TFT. Furthermore, in the case of performing X-ray fluoroscopy for a long time period, such as an examination and a treatment with a catheter, keeping the X-ray radiation dose low is strongly required for reducing the amount of radiation that the patient and the practitioner receive. Thus, required specification is an X-ray image sensor that is able to provide a high signal-to-noise ratio (SN ratio) even if the signal quantity is low.

As means for achieving an X-ray image sensor with a high frame rate, an oxide semiconductor TFT with high current driving capability may be conceived. However, the oxide semiconductor TFT has a problem that the oxide semiconductor may metamorphose because of hydrogen included in raw material gas of the hydrogenated amorphous silicon (a-Si:H) thin film that forms the photodiode (hereinafter, referred to as a PD) functioning as a photoelectric conversion element. The deterioration of the oxide semiconductor causes degradation of the TFT characteristics. As a countermeasure, the inventors have proposed an X-ray image sensor disclosed in Japanese Patent Application Laid-Open No. 2015-90957. FIG. 18 is a cross-sectional view illustrating the structure of an image sensor disclosed in Japanese Patent Application Laid-Open No. 2015-90957. The image sensor disclosed in Japanese Patent Application Laid-Open No. 2015-90957 has a structure in which a PD 400 made of hydrogenated a-Si and an oxide semiconductor TFT 300 are formed in this order on a substrate 700 as illustrated in FIG. 18. The image sensor has a structure in which a gas barrier film 730 for preventing hydrogen gas from permeating is placed between the PD 400 and the oxide semiconductor TFT 300. In this structure, the a-Si PD 400 is formed, and then the oxide semiconductor TFT is formed thereon. This allows the oxide semiconductor TFT to be less affected by hydrogen contained in raw material gas of the hydrogenated a-Si. Furthermore, the gas barrier film 730 prevents the hydrogen gas contained in the a-Si PD 400 from diffusing to the oxide semiconductor TFT 300 due to heat treatment at the time of forming the oxide semiconductor TFT 300. This makes it possible to suppress a variation of the characteristics of the oxide semiconductor TFT 300.

Meanwhile, the technique of enhancing the SN ratio of an image sensor includes an active pixel sensor (APS) that is applied to a complementary metal-oxide-semiconductor (CMOS) image sensor. This technique achieves enhancement of the SN ratio by providing each pixel with an amplifier circuit, amplifying a signal from a photoelectric conversion element and outputting the amplified signal.

A method of manufacturing an APS-using image sensor by employing oxide semiconductor TFTs includes a technique disclosed in Japanese Patent Application Laid-Open No. 2011-211171. FIG. 19 is a circuit diagram illustrating a circuit configuration of one pixel of an image sensor disclosed in Japanese Patent Application Laid-Open No. 2011-211171. One pixel of the image sensor is composed of one oxide semiconductor TFT 901 and one PD 902. A gate terminal of the TFT 901 is connected to a selection signal line SEL. A drain terminal of the TFT 901 is connected to an output signal line OUT. A source terminal of the TFT 901 is connected to a photo-sensor reference signal line GND. An anode terminal of the PD 902 is connected to a photodiode reset signal line RST. A cathode terminal of the PD 902 is connected to a back gate of the TFT 901. FIG. 20 is a cross-sectional view illustrating the sectional structure of the image sensor disclosed in Japanese Patent Application Laid-Open No. 2011-211171. The oxide semiconductor TFT disclosed here is of channel etch type and has an inversely staggered structure. In the oxide semiconductor TFT 901, the bottom gate functioning as a main gate is placed at the lower part of the semiconductor layer (substrate side). The oxide semiconductor TFT has a structure in which the oxide semiconductor TFT 901 and the a-Si PD 902 are formed in this order on a substrate 903. A back gate electrode 912 placed in contact with an n-a-Si layer 913 of the a-Si PD is arranged above the channel of the oxide semiconductor TFT 901 via an insulator film 910 and a protection insulating film 911. When the PD 902 is irradiated by light to change the cathode potential, the potential of the back gate electrode 912 also changes. As the potential of the back gate electrode 912 changes, the threshold voltage of the oxide semiconductor TFT 901 also changes. Reading of the signal is performed by switching the selection signal line SEL to a high level to make the oxide semiconductor TFT 901 conductive, and changing the potential of the output signal line OUT that has previously been charged to high voltage. Other examples of the method of modulating the threshold voltage of the transistor by the change of the potential of the PD as disclosed herein are also disclosed in Japanese Patent Application Laid-Open No. 1990-180071 and Japanese Patent Application Laid-Open No. 2009-147056 that employ crystalline silicon as a substrate.

SUMMARY

However, as a result of reviewing of the APS-using image sensor employing oxide semiconductor TFTs in detail, the inventors found that mere combination of the methods that have already been disclosed cannot produce an image sensor with sufficient performance.

For the image sensor disclosed by the inventors in Japanese Patent Application Laid-Open No. 2015-90957, a PD and an oxide semiconductor TFT are laminated on a substrate in this order, which hampers achievement of a high SN ratio and high spatial resolution at the same time. The reason is as follows. The PD is arranged closer to the substrate, which requires light to be incident from the substrate side in order to make a light receiving area of the PD larger. In this case, a scintillator is arranged on the rear face of the substrate to thereby widen the distance between the scintillator and the PD. Consequently, the visible light pumped by the scintillator is irradiated onto the adjacent PDs, resulting in low spacial resolution. In contrast, a scintillator is arranged on a TFT side, light is not irradiated onto the PD overlapped with the TFT on the plane to thereby make the effective light receiving area of the PD smaller, resulting in a low SN ratio.

For the image sensor disclosed in Japanese Patent Application Laid-Open No. 2011-211171, a PD and an oxide semiconductor TFT are laminated in this order on a substrate. This causes a problem that the oxide semiconductor may metamorphose by hydrogen included in raw material gas at the time of forming the PD, resulting in degradation in TFT characteristics. Furthermore, the inventors found an essential problem that even if the TFT is normally operated, the amplification factor of a TFT for amplification arranged on a pixel is small, which causes a severe drop of the SN ratio.

An image sensor according to the present disclosure including a plurality of pixels arranged in matrix, each pixel comprises a substrate; a first TFT comprising a first gate electrode arranged on the substrate, a first semiconductor including an oxide semiconductor laminated above the first gate electrode via an insulator film, a first source electrode and a first drain electrode that are laminated on the first semiconductor, and a second gate electrode arranged above the first semiconductor, wherein the first source electrode is electrically connected to the first gate electrode, and the first drain electrode is electrically connected to a power line; a second TFT comprising a third gate electrode constructed by the same layer as the first gate electrode on the substrate, a second semiconductor including an oxide semiconductor laminated above the third gate electrode via the insulator film, the oxide semiconductor being constructed by the same layer as the first semiconductor, and a second source electrode and a second drain electrode that are laminated on the second semiconductor, wherein the second drain electrode is electrically connected to the first gate electrode, the second source electrode is electrically connected to a signal line, and the third gate electrode is electrically connected to a first control line; and a photoelectric conversion element comprising an a-Si thin film, a first electrode electrically connected to a first surface of the a-Si thin film and the second gate electrode of the first TFT and a second electrode connected to a second control line, and being arranged above the first TFT so as to be superposed on the first TFT in an laminated direction, wherein a gas barrier film that is positioned between the first and the second TFTs and the photoelectric conversion element and that prevents hydrogen from permeating into the first and the second TFTs is provided, the first electrode and the second gate electrode are constructed by the same layer, and the gas barrier film is not provided with an aperture in each of the pixels.

The above and further objects and features will more fully be apparent from the following detailed description with accompanying drawings.

It is to be understood that both the foregoing general description and the following detailed description are exemplary and explanatory and are not restrictive of this disclosure.

BRIEF DESCRIPTION OF SEVERAL VIEWS OF DRAWINGS

MODES FOR CARRYING OUT THE INVENTION

Figure 1:
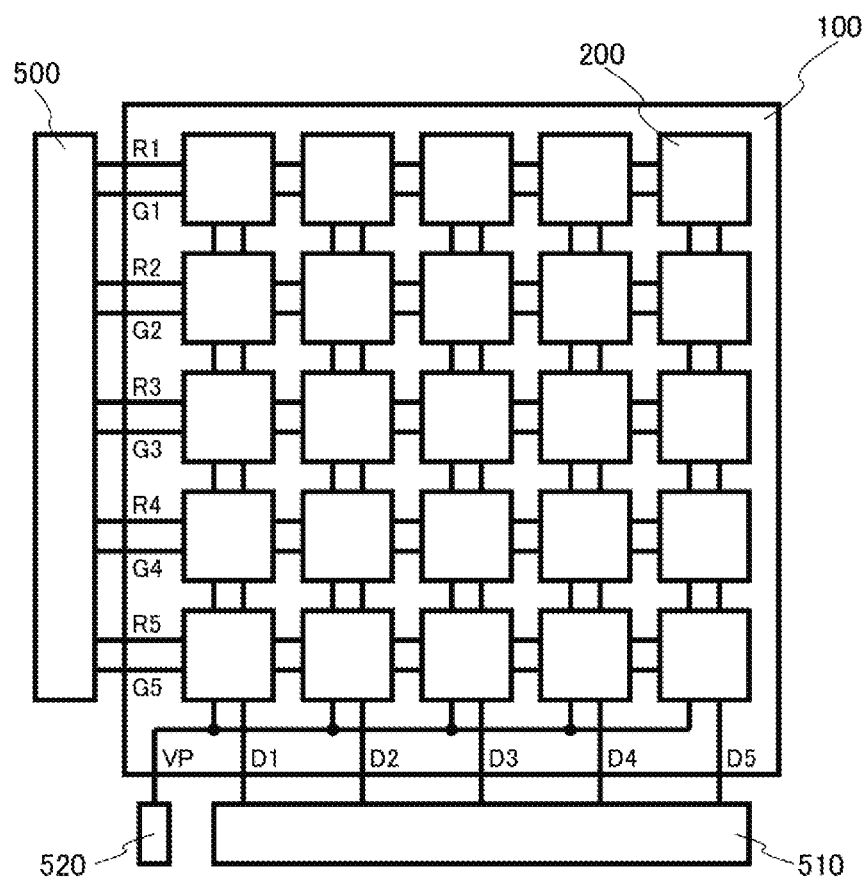
FIG. 1 is an illustrative view illustrating an example of a configuration of an image sensor.

Embodiments of the present disclosure will be described in detail with reference to the drawing below. It should be noted that, in order to have visibility of the drawings, the size and the scale of each component in each drawing are changed as appropriate. The hatching in each of drawings is for distinguishing one component from another and does not necessarily mean a cross section.

Embodiment 1

FIG. 1 is an illustrative view illustrating an example of the configuration of an image sensor. In an image sensor 100 according to the present embodiment, pixels 200 are arranged on a substrate (not illustrated) in matrix. For each pixel line of the image sensor 100, each common selection line G1-G5 and each common reset line R1-R5 are arranged. For each pixel column of the image sensor 100, each common signal line D1-D5 is arranged. In all of the pixels 200 of the image sensor 100, common power supply lines VP are arranged. The selection lines G1-G5 and the reset lines R1-R5 are connected to a driving circuit 500. The signal lines D1-D5 are connected to a detection circuit 510. The power supply lines VP are connected to a power supply circuit 520.

Here, the driving circuit 500, the detection circuit 510 and the power supply circuit 520 may be formed on the substrate. The driving circuit 500, the detection circuit 510 and the power supply circuit 520 may be connected to the image sensor via a flexible substrate or the like. Though 5 lines by 5 columns of the pixels 200 are arranged in matrix in FIG. 1 for simplifying the description, the number of pixels is mere one example. This does not intend to indicate the restriction on the number of pixel lines and the number of pixel columns. The pixels 200 may be arranged in a one-dimensional array.

Figure 2:
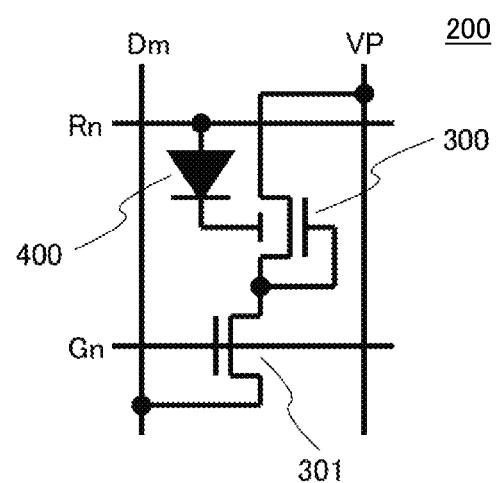
FIG. 2 is a circuit diagram illustrating one example of a circuit of one pixel.

FIG. 2 is a circuit diagram illustrating one example of a circuit of one pixel. Each pixel 200 of the image sensor includes two TFTs 300 and 301 and one PD 400. An anode terminal of the PD 400 is connected to a reset line Rn. A cathode terminal of the PD 400 is connected to a back gate terminal of the TFT 300. A drain terminal of the TFT 300 is connected to a power supply line VP. A source terminal of the TFT 300 is connected to a drain terminal of the TFT 301 and a gate terminal of the TFT 300. A source terminal of the TFT 301 is connected to a signal line Dm. A gate terminal of the TFT 301 is connected to a selection line Gn.

Figure 3:
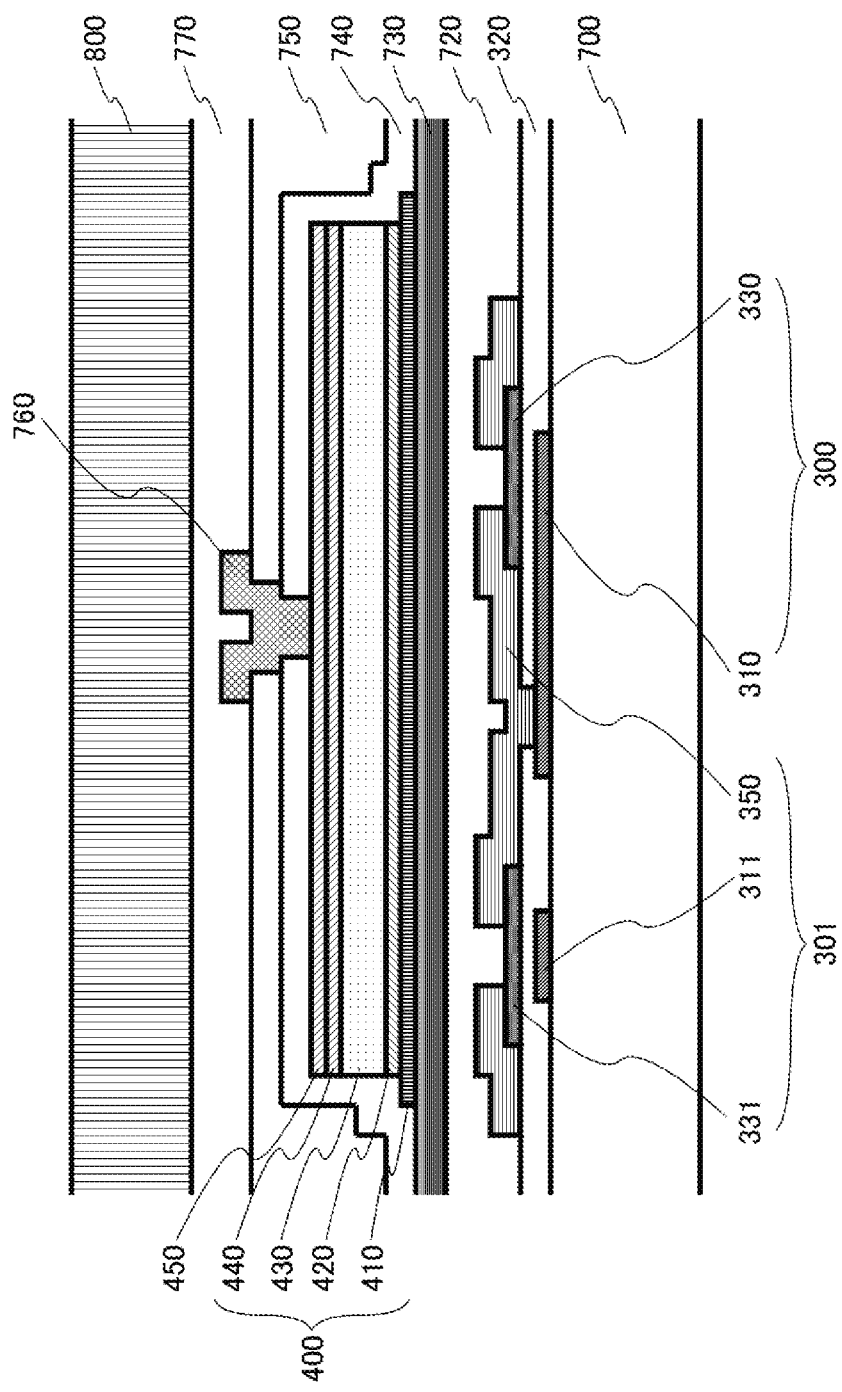
FIG. 3 is a cross-sectional view illustrating one example of a sectional structure of the image sensor.

FIG. 3 is a cross-sectional view illustrating one example of a sectional structure of the image sensor. The image sensor includes gate electrodes 310 and 311 formed on a substrate 700. A gate insulating film 320 is laminated on the gate electrodes 310 and 311. Oxide semiconductor films 330 and 331 are formed on the gate insulating film 320. A source and drain metal 350 constituting a source electrode and a drain electrode is formed on the oxide semiconductor films 330 and 331. An interlayer film (interlayer insulating film) 720 and a gas barrier film 730 are laminated on the source and drain metal 350. The PD 400 is formed on the gas barrier film 730. The PD 400 includes a lower electrode (first electrode) 410, an n-a-Si 420, an i-a-Si 430, a p-a-Si 440 and an upper electrode (second electrode) 450. The n-a-Si 420 is an n-type a-Si thin film. The i-a-Si 430 is an intrinsic a-Si thin film. The p-a-Si 440 is a p-type a-Si thin film. The lower electrode 410, the n-a-Si 420, the i-a-Si 430, the p-a-Si 440 and the upper electrode 450 are laminated on the gas barrier film 730 in this order. On the PD 400, a protective film 740 and a passivation film 750 are laminated. On the passivation film 750, a wiring metal film 760 is formed. The wiring metal film 760 is electrically connected to the upper electrode 450 through a contact hole. A flattening film 770 is laminated as necessary, and a scintillator 800 is deposited on the flattening film 770.

The image sensor according to the present embodiment is an example where a channel etch type TFT with an inversely staggered structure is applied to the TFTs 300 and 301. For the TFT 300, the gate electrode 310 that is placed on the substrate 700 and placed under the oxide semiconductor film 330 is called a bottom gate. For the TFT 301, the gate electrode 311 that is placed on the substrate 700 and placed under the oxide semiconductor film 331 is called a bottom gate. The gate electrodes 310 and 311 function as main gates. Meanwhile, the lower electrode 410 of the PD 400 that is placed above the oxide semiconductor films 330 and 331 and is overlapped with the channel regions of the TFT 300 and 301 in a plan view functions as a back gate.

Figure 4:
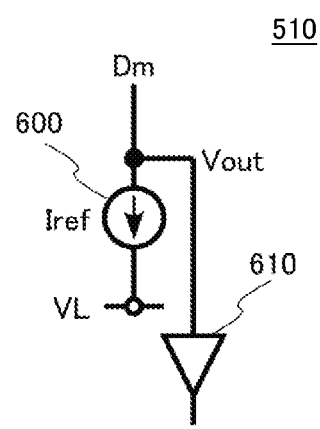
FIG. 4 is a circuit diagram illustrating an example of a configuration of a detection circuit.

FIG. 4 is a circuit diagram illustrating an example of a configuration of a detection circuit. The detection circuit 510 is provided for each signal line. The detection circuit 510 includes a constant-current power 600 and a voltage amplification circuit 610.

Figure 5:
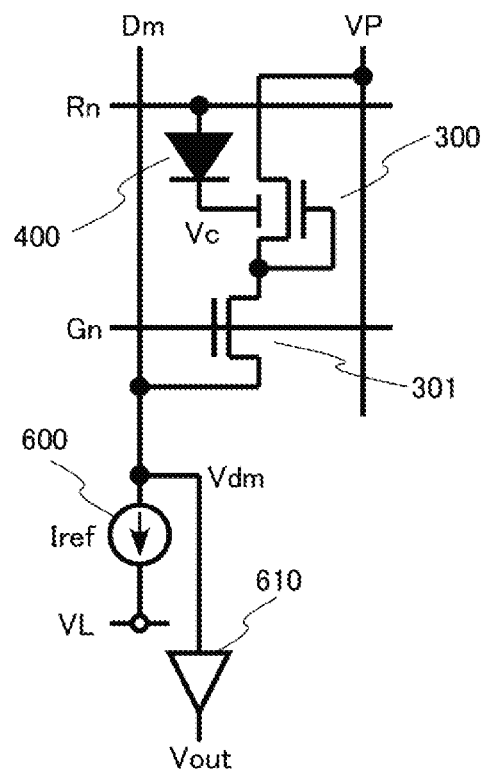
FIG. 5 is a circuit diagram illustrating an equivalent circuit for describing operation at one pixel of the image sensor.
Figure 6:
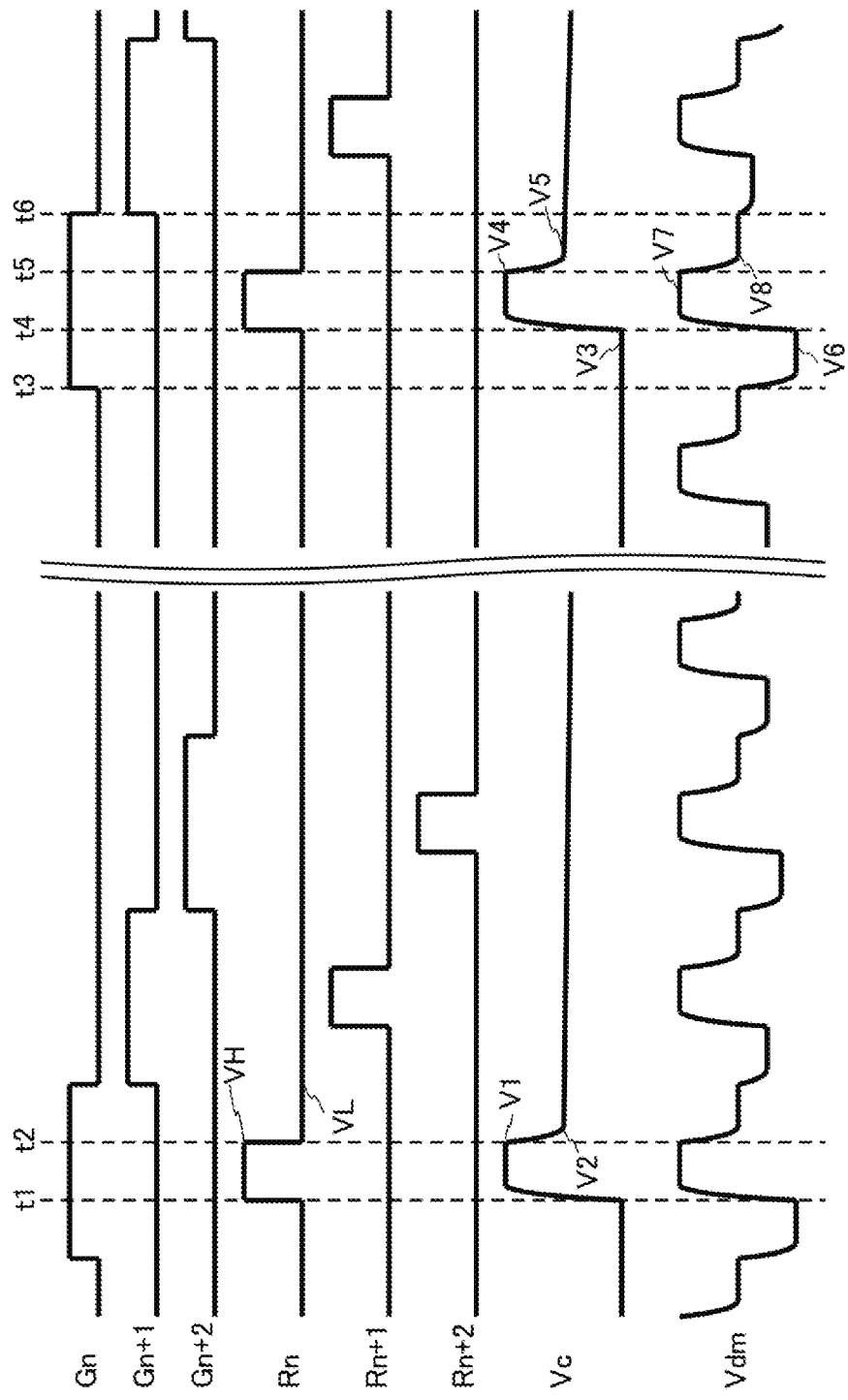
FIG. 6 is a timing chart illustrating an example of operation of the image sensor.

The following describes operation of the image sensor according to the present embodiment. FIG. 5 is a circuit diagram illustrating an equivalent circuit for describing operation at one pixel of the image sensor. The circuit illustrated in FIG. 5 is an equivalent circuit when the circuit illustrated in FIG. 4 is connected as a detection circuit of the image sensor. FIG. 6 is a timing chart illustrating an example of operation of the image sensor. As illustrated in FIG. 6, the reset line Rn is set at a high level from time t1 to time t2. This makes forward voltage flow into the PD 400 illustrated in FIG. 5 and causes the PD 400 to be reset. The voltage $V_{pd}$ (the potential difference between the cathode terminal and the anode terminal) across the PD 400 at time t2 when the Rn is set at a low level is indicated by the following equation (1).

$$V_{pd} = -\frac{C_{cp}(V_H - V_L)}{C_{cp} + C_{pd}} + V_{thpd} \qquad (1)$$

Here, $V_L$ represents the low level voltage of the Rn. $V_H$ represents the high level voltage of the Rn. $C_{pd}$ represents equivalent capacitance of the PD 400. $C_{cp}$ represents parasitic capacitance that is connected to the cathode terminal of the PD 400. $V_{thpd}$ represents threshold voltage of the PD 400. As understood from Equation (1), by the reset operation described above, the PD 400 is in a state where a reverse bias voltage is applied.

When the PD is irradiated by light from time t2 to time t3 in this state, the charge retained in the PD 400 decreases. Assuming that the cathode potential immediately after the reset of the PD 400 is indicated by V2, it decreases as indicated by V3 in accordance with the light amount irradiated on the PD.

Successively, at time t3, the selection line Gn is set at a high level. This makes the TFT 301 conductive, which causes current to flow into the signal line Dm in accordance with the gate potential of the TFT 300. Meanwhile, the signal line Dm is connected to the constant-current power 600, and thus the current flowing into the signal line Dm is kept constant. In the example in FIG. 5, the current value of the constant-current power 600 is regarded as Iref. Thus, the potential Vdm of the signal line Dm changes such that current flowing through the TFTs 300 and 301 coincides with Iref. The potential Vdm is voltage depending on Vc that is equal to the gate voltage of the TFT 300.

The potential of the reset line Rn is set at a high level at time t4. The potential of the reset line Rn is changed to a low level at time t5. This causes the PD 400 to be reset. Here, the selection line Gn is set at a high level from time t3 to time t6. Thus, the potential Vdm of the signal line Dm changes in accordance with the cathode voltage Vc after the reset of the PD 400 during a period from time t5 to time t6. Here, the potential of Vdm from time t3 to time t4 is regarded as V6 while the potential of Vdm from time t5 to time t6 is regarded as V8. The potential V6 is voltage depending on the amount of light irradiated onto the PD 400 from time t2 to time t3. The potential V8 is voltage depending on the cathode voltage of the PD 400 after the reset. Accordingly, by obtaining the difference between the potential V6 and the potential V8, correlation double sampling is performed. Thus, only the signal voltage component in accordance with the amount of the light irradiated onto the PD 400 can be obtained without being affected by the threshold voltage of the PD 400 and the threshold voltage of the TFT 300.

From the description above, the image sensor according to the present embodiment enables high resolution, a high-speed operation and a high SN ratio. Furthermore, the image sensor may obtain high yield without causing the characteristics deterioration though it has a structure in which the PD 400 is laminated above the oxide semiconductor film TFTs 300 and 301. The following describes the reason.

For the image sensor according to the present disclosure, the PD 400 is arranged above the TFTs 300 and 301 as illustrated in FIG. 3. This makes it possible to keep the fill factor of the PD 400 large even if the size of the pixel is made small, which enables high resolution. As an oxide semiconductor is employed as semiconductor layers of the TFTs 300 and 301, a high current driving capacity and a high speed operation are made possible.

The oxide semiconductor TFT has a problem of the fluctuation of the TFT characteristics when undergoes hydrogen diffusion after forming of the oxide semiconductor film. Thus, when the PD is laminated on the oxide semiconductor TFT, large amount of hydrogen contained in raw material gas of the a-Si thin film constituting a PD permeates in the oxide semiconductor film. This causes sharp characteristics fluctuation of the TFT, resulting in an abnormal operation. However, for the image sensor according to the present embodiment, the gas barrier film 730 for preventing hydrogen from permeating is arranged between the oxide semiconductor TFTs 300 and 301 and the PD 400. Of special notice is that no contact hole is formed on the gas barrier film 730 at the pixel region. This structure makes it possible to enhance the effect of preventing the hydrogen from permeating and to greatly prevent yield from decreasing due to the characteristics variation of the TFTs 300 and 301.

In addition, the PD 400 laminated above the TFT 300 and 301 allows a scintillator to be arranged above the PD 400 closely. In the case where the PD 400 and the scintillator are arranged with a long distance, the light emitted from the scintillator propagates in the lateral direction, which drastically reduces the spatial resolution. The structure of the image sensor according to the present embodiment can shorten the distance. This makes it possible to keep the spatial resolution high, which enables high resolution.

In the image sensor according to the present embodiment, the TFT 300 for amplification is arranged for each pixel to output the voltage from the PD 400 in an amplified manner, which provides a high SN ratio. Furthermore, though the image sensor according to the present embodiment has a circuit configuration in which the voltage of the PD 400 is input to the back gate of the TFT 300 for amplification, the gain of the amplifier circuit never fluctuates by the voltage of the bottom gate. This makes it possible to increase the gain of the amplifier circuit and to thus obtain a high SN ratio. The following describes the reason in detail.

In the image sensor of the present disclosure, like the circuit illustrated in FIG. 5, a cathode of the PD 400 is connected to the back gate of the TFT 300 for amplification. A bottom gate of the TFT 300 is connected to the source terminal. For the TFT having the bottom gate and the back gate, the current flowing between the source and the drain is controlled by both of the bottom gate voltage and the back gate voltage. Here, the capacitance between the oxide semiconductor film and the bottom gate is regarded as $C_{BI}$. The capacitance between the oxide semiconductor film and the back gate is regarded as $C_{KI}$. The capacitance of the oxide semiconductor film is assumed to be enough larger than $C_{BI}$ and $C_{KI}$. In this case, the current flowing into the saturated region of the TFT is closely related as follows.

$$Id = \frac{1}{2}\frac{W}{L}\mu_0 C_0 (V_{Bgs} + \alpha V_{Kgs} - V_{th})^2 \qquad (2)$$

$$\alpha = \frac{C_{KI}}{C_{BI}} \qquad (3)$$

$$C_0 = (C_{KI} + C_{BI}) \qquad (4)$$

W and L represent the channel width and the channel length of the TFT, respectively. $\mu_0$ represents the field effect mobility of the TFT. $V_{th}$ represents the threshold voltage of the TFT. $V_{Kgs}$ represents the back gate voltage with respect to the source terminal in the TFT. $V_{Bgs}$ represents the bottom gate voltage with respect to the source terminal in the TFT. Since the TFT having the bottom gate and the back gate is used in this manner, in the case where signal voltage is applied to one of the gates, the current flowing through the TFT is affected by the voltage of the other gate. This is due to a principle similar to the substrate bias effect in the transistor formed by crystalline silicon.

Successively, the voltage of the signal line Dm in FIG. 5 is evaluated using Equation (2). For the image sensor according to the present embodiment, upon reading out of the signal of a pixel, high voltage is applied to the gate of the TFT 301. This makes the TFT 301 conductive and causes the TFT 300 to be connected to the signal line Dm. Here, since the constant current source 600 is connected to the signal line Dm, current flowing through the signal line Dm, the TFT 301 and the TFT 300 is made constant. The current value of the constant current source 600 is regarded as Iref. It is assumed that the voltage drop at the TFT 301 is small enough, and the voltage of the source terminal of the TFT 301 is equal to the voltage $V_{dm}$ of the signal line Dm. In this case, the voltage of the signal line Dm is evaluated by Equation (2) as follows.

$$V_{dm} = V_C - \frac{1}{\alpha}\left(\sqrt{\frac{2LI_{ref}}{\mu_0 C_0 W}} + V_{th}\right) \qquad (5)$$

For simplifying the description, it is assumed that the voltage between the source and the drain of the TFT 301 is enough small here. However, even if the voltage cannot be negligible, the voltage of the signal line Dm is a mere value to or from which constant offset voltage is added or subtracted, which little affects the gain. In the image sensor according to the present embodiment, the output voltage $V_{dm}$ is proportional to the signal voltage $V_c$ as understood from Equation (5). In other words, the gain of the source follower circuit by the TFT 300 is 1.

Figure 19:
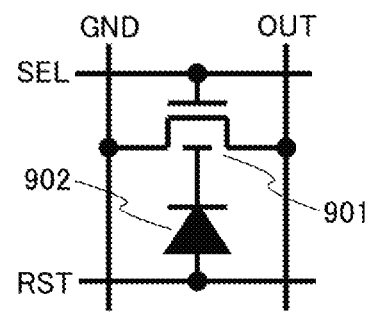
FIG. 19 is a circuit diagram illustrating a circuit configuration of one pixel of an image sensor disclosed in Japanese Patent Application Laid-Open No. 2011-211171.
Figure 20:
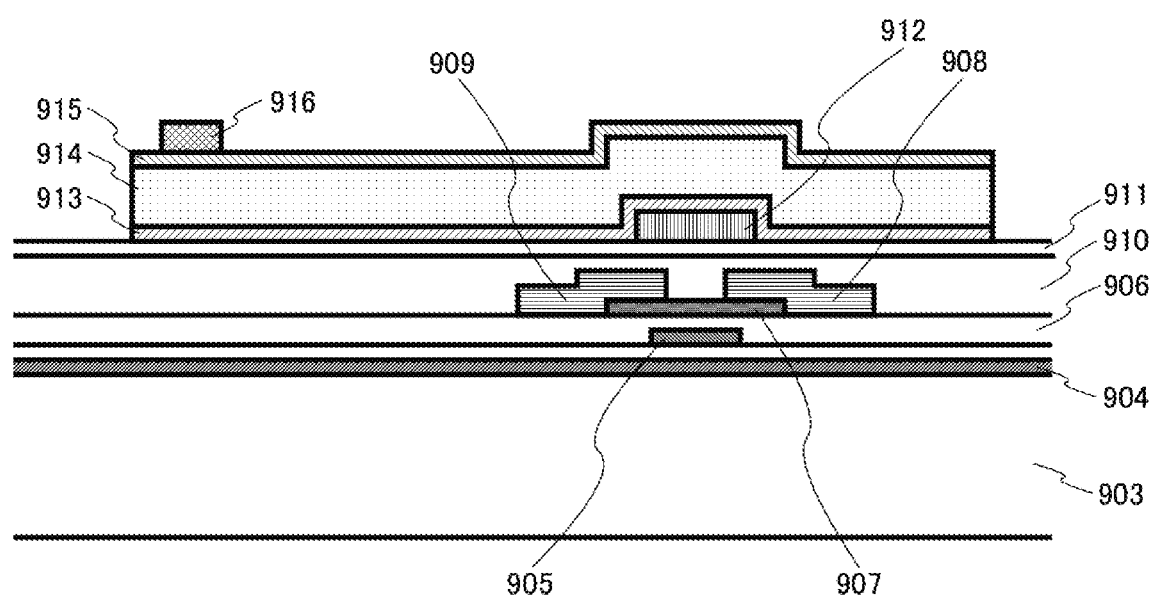
FIG. 20 is a cross-sectional view illustrating a sectional structure of the image sensor disclosed in Japanese Patent Application Laid-Open No. 2011-211171.

In contrast thereto, the configuration disclosed in Japanese Patent Application Laid-Open No. 2011-211171 does not provide a high SN ratio. In the method for reading the signal disclosed in Japanese Patent Application Laid-Open No. 2011-211171, the output signal line OUT illustrated in FIG. 19 is previously charged to high voltage, and then the selection signal line is set to a high level to thereby make the TFT 901 conductive. It is described that the potential of the output signal line OUT is then lowered. Thus, the TFT 901 is not utilized as an amplifier circuit like a source follower circuit. In this method, the potential of the output signal line OUT may significantly fluctuate due to the conduction time of the TFT 901 and slight fluctuations of the high level voltage of the selection signal line. Thus, variations in the offset voltage of the signal voltages obtained from the respective pixels and noise may be expected to be high.

Figure 21:
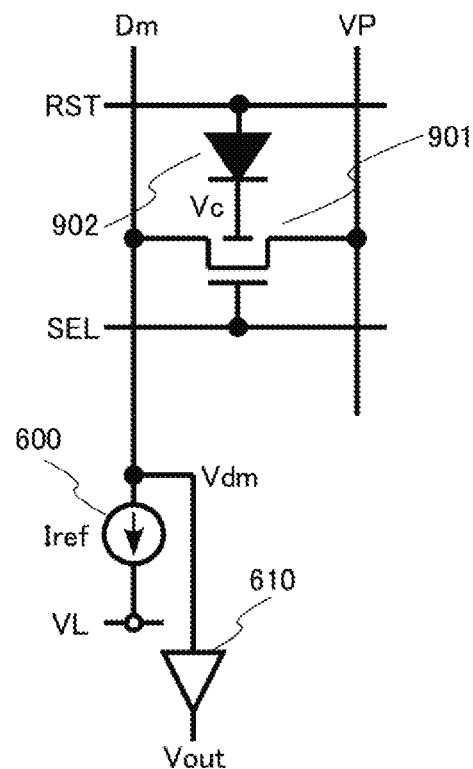
FIG. 21 is a circuit diagram in the case where a TFT is regarded as a source follower circuit in the configuration disclosed in Japanese Patent Application Laid-Open No. 2011-211171.

However, in the configuration disclosed in Japanese Patent Application Laid-Open No. 2011-211171, the TFT 901 can also be utilized as a source follower circuit. FIG. 21 is a circuit diagram in the case where the TFT is regarded as a source follower circuit in the configuration disclosed in Japanese Patent Application Laid-Open No. 2011-211171. Such a configuration as illustrated in FIG. 21 can solve the problems of variations in the offset voltage of the signal voltage and noise that would have occurred in the method disclosed in Japanese Patent Application Laid-Open No. 2011-211171. However, the gain of the source follower circuit is far smaller than 1, resulting in a new problem of inability to gain a high SN ratio. The voltage of the signal line Dm in the circuit in FIG. 21 calculated by the approximate expression of Equation (2) is as follows.

$$V_{dm} = \frac{a}{1+\alpha}V_c - \frac{1}{1+\alpha}\left(\sqrt{\frac{2LI_{ref}}{\mu_0 C_0 W}} + V_{th} - V_{SELH}\right) \quad (6)$$

Here, $V_{SELH}$ is the high-level voltage of the selection signal line. As understood from Equation (6), the gain of the source follower circuit is $\alpha/(1+\alpha)$, where $\alpha$ takes a positive value as shown in Equation (3). Thus, the gain is a value equal to or smaller than 1. In other words, the signal voltage Vc is attenuated and output.

In order to increase the gain as large as possible, it is only necessary to make $C_{KI}$ larger than $C_{BI}$. To increase $C_{KI}$ means reduction in the thickness of the insulator film arranged between the oxide semiconductor film and the lower electrode of the PD, resulting in use of an insulator film with a high dielectric constant. However, the gas barrier film for preventing the hydrogen from diffusing to the oxide semiconductor film at a time of forming the PD is required to be arranged between the TFT and the PD.

Figure 7:
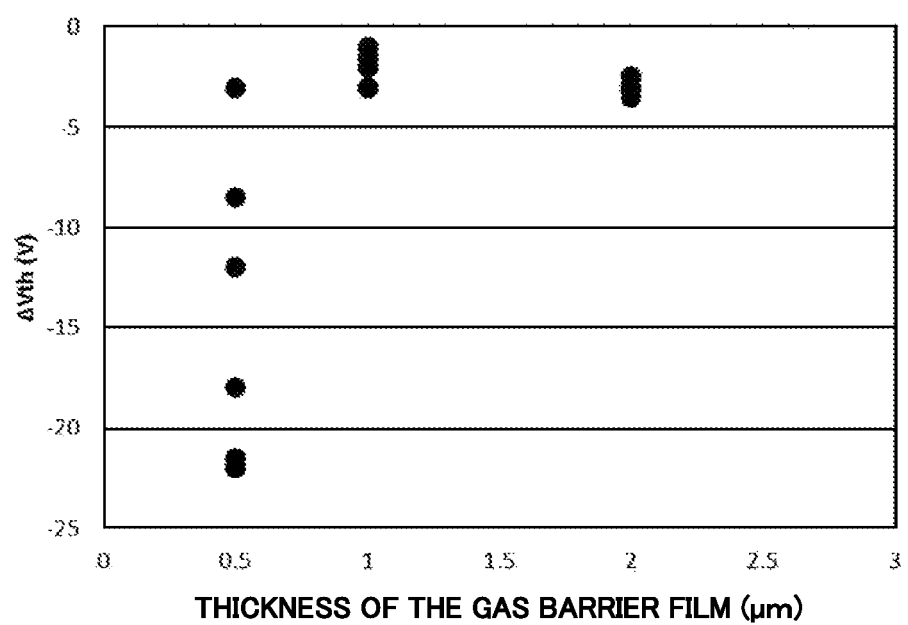
FIG. 7 is a graph illustrating fluctuation of threshold voltage of an oxide semiconductor TFT.

FIG. 7 is a graph illustrating fluctuation of the threshold voltage of an oxide semiconductor TFT. FIG. 7 depicts how much the threshold voltage fluctuates between before and after forming of the PD. P-xylene polymer is employed for the gas barrier film. As understood from FIG. 7, the fluctuation ΔVth of the threshold voltage between before and after forming of the PD depends on the thickness of the gas barrier film. In other words, as the gas barrier film is thick, the fluctuations are little. According to the experimental results by the inventors, the gas barrier film with a thickness equal to or larger than at least 1 μm is required. In other words, the thickness of the gas barrier film cannot be reduced.

As a detailed example, the insulator film between the bottom gate and the oxide semiconductor film is assumed to be a silicon oxide film with a thickness of 400 nm. Between the oxide semiconductor film and the lower electrode of the PD, a silicon oxide film having a thickness of 100 nm and p-xylene polymer functioning as a gas barrier film having a thickness of 1 μm are formed. In this case, a is about 0.22, and the gain is about 0.19. In this calculation, the dielectric constants of the silicon oxide film and the p-xylene polymer are 4 and 3.3, respectively. Thus, this configuration makes the gain far smaller than 1 and cannot provide a high SN ratio.

The image sensor according to the present embodiment includes a plurality of pixels arranged in matrix. Each pixel includes a substrate, a first TFT, a second TFT and a photoelectric conversion element. A gas barrier film that is positioned between the first and second TFTs and the photoelectric conversion element and that prevents hydrogen from diffusing to the first and second TFTs is provided. A first electrode and a second gate electrode are constructed by the same layer. In each pixel, no aperture is provided on the gas barrier film. The first TFT is the TFT 300, for example. The second TFT is the TFT 301, for example. The photoelectric conversion element is the PD 400, for example. The first electrode is the lower electrode 410, for example. The second gate electrode is the lower electrode 410 of the PD 400 functioning as the gate electrode of the TFT 301, for example. The gas barrier film is the gas barrier film 730, for example.

The first TFT includes a first gate electrode arranged on the substrate, a first semiconductor including an oxide semiconductor laminated above the first gate electrode via an insulator film, a first source electrode and a first drain electrode that are arranged on the first semiconductor, and a second gate electrode laminated above the first semiconductor. The first source electrode is electrically connected to the first gate electrode while the first drain electrode is electrically connected to a power line. The first semiconductor is the oxide semiconductor film 330, for example. The first source electrode and the first drain electrode are parts of the source and drain metal 350, for example.

The second TFT includes a third gate electrode constructed by the same layer as the first gate electrode on the substrate, a second semiconductor including an oxide semiconductor laminated above the third gate electrode via an insulator film and an oxide semiconductor constructed by the same layer as the first semiconductor, and a second source electrode and a second drain electrode that are laminated on the second semiconductor. The second drain electrode is electrically connected to the first gate electrode, the second source electrode is electrically connected to a signal line, and the third gate electrode is electrically connected to a first control line. The third gate electrode is the gate electrode 311, for example. The second semiconductor is the oxide semiconductor film 331, for example. The second source electrode and the second drain electrode are parts of the source and drain metal 350, for example.

The photoelectric conversion element includes an a-Si thin film, a first electrode electrically connected to the first surface of the a-Si thin film and the second gate electrode of the first TFT, and a second electrode connected to a second control line, and the photoelectric conversion element is arranged above the first TFT so as to be superposed on the first TFT in a laminated direction. The a-Si thin film is the n-a-Si 420, the i-a-Si 430 and the p-a-Si 440, for example. The second electrode is the upper electrode 450, for example.

In the image sensor according to the present embodiment, the first source electrode and the second drain electrode are made of the same metal layer, and the first source electrode is connected to the first gate electrode via a contact hole provided on an insulator film. The same metal layer described here is parts of the source and drain metal 350, for example. The insulator film is the protective film 740 and the passivation film 750, for example.

In the image sensor according to the present embodiment, the first electrode and the second gate electrode are laminated on the gas barrier film.

By using the image sensor described above, the following sensor device can be configured.

The sensor device is provided with an image sensor and a control circuit including a power output terminal for outputting power to the power line, a first control output terminal for outputting a first control signal to the first control line, a second control output terminal for outputting a second control signal to the second control line, and an input terminal to which potential output from the second source electrode of the second TFT is to be input via the signal line.

For operation of the sensor device, the operating period of the image sensor is classified as a read-out period and an accumulation period. During the read-out period, the control circuit performs a first observing operation of changing, from low-level voltage to high-level voltage, a first control signal that is output from the first control output terminal and is applied to the third gate electrode of the second TFT via the first control line, and observing potential of an input signal that is output from the second source electrode and is applied to the input terminal via the signal line, a reset operation of, after the first observing operation, changing, from low-level voltage to high-level voltage, the second control signal that is output from the second control output terminal and is applied to the second electrode of the photoelectric conversion element via the second control line and then restoring the second control signal to low-level voltage again, and a second observing operation of observing potential of the input signal and restoring the second control signal to low-level voltage after the reset operation. The control circuit outputs a difference between potential observed by the first observing operation and potential observed by the second observing operation.

During the accumulation period, the control circuit retains the first control signal and the second control signal at the low-level voltage and performs operation of accumulating signal charges by light into the photoelectric conversion element. The operation during the read-out period and during the accumulation period are alternately performed.

The control circuit is a circuit including the driving circuit 500 and the detection circuit 510, for example. The power output terminal is a terminal connected to the VP terminal in FIG. 5, for example. The first control output terminal is a terminal for outputting a signal Gn in FIG. 6. The second control output terminal is a terminal for outputting a signal Rn in FIG. 6. The reset operation is the operation performed from time t1 to time t2 and performed from time t4 to time t5. The first observing operation is the operation performed from time t3 to time t4 in FIG. 6. The second observing operation is the operation performed from time t5 to time t6.

Embodiment 2

Figure 8:
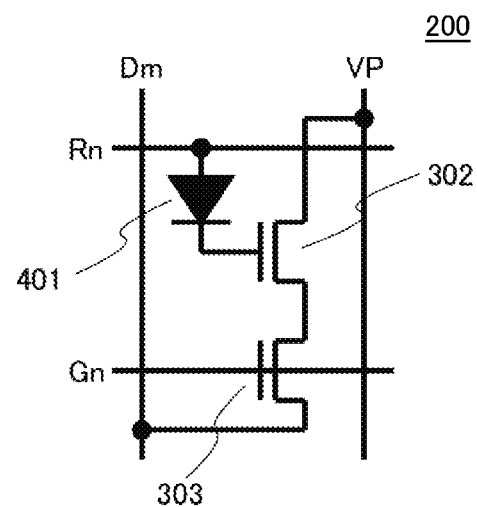
FIG. 8 is a circuit diagram illustrating another example of a configuration of a circuit of one pixel of the image sensor.

FIG. 8 is a circuit diagram illustrating another example of a configuration of a circuit by one pixel of the image sensor. The image sensor according to the present embodiment can use similar components to those of Embodiment 1 illustrated in FIG. 1. In the image sensor according to the present embodiment, one pixel includes two TFTs 302 and 303 and a PD 401.

Figure 9:
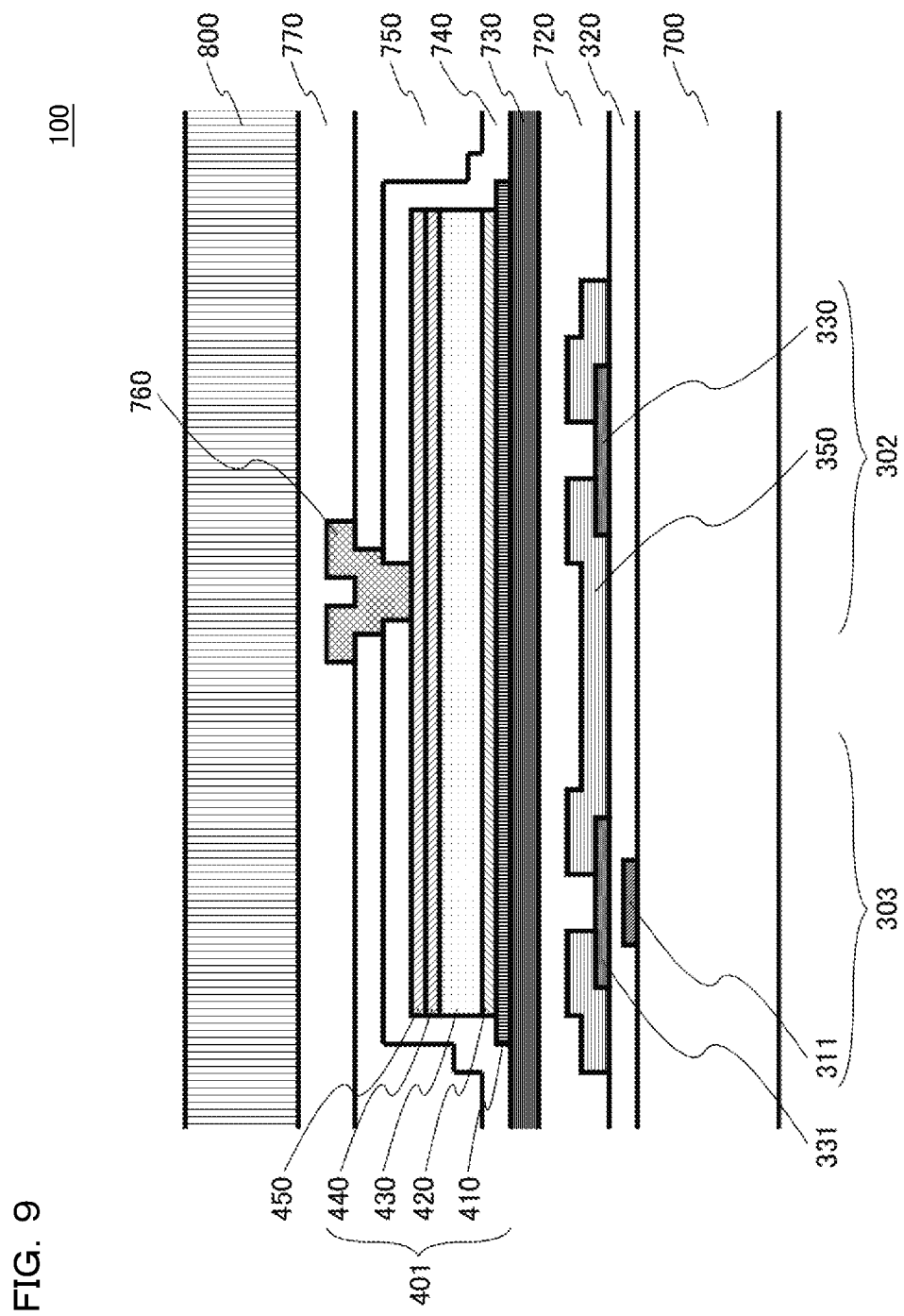
FIG. 9 is a cross-sectional view illustrating another example of a sectional structure of the image sensor.

FIG. 9 is a cross-sectional view illustrating another example of a sectional structure of the image sensor. The TFT 303 has an inversely staggered structure in which a bottom gate 311 is arranged under the oxide semiconductor film 331. Meanwhile, the TFT 302 has a structure in which no bottom gate is arranged under the oxide semiconductor film 330. The TFT 302 has a structure in which the lower electrode 410 of the PD 401 is made to function as a back gate (may also be called a top gate). The TFT 302 has a staggered structure.

As a circuit configuration, an anode terminal of the PD 401 is connected to a reset line Rn. A cathode terminal of the PD 401 is connected to a back gate of the TFT 302. A drain terminal of the TFT 302 is connected to a power line VP. A source terminal of the TFT 302 is connected to a drain terminal of the TFT 303. A gate terminal of the TFT 303 is connected to a selection line Gn. A source terminal of the TFT 303 is connected to a signal line Dm. This connection mode allows the TFT 302 to function as an amplifier circuit for amplifying the cathode voltage of the PD 401.

As illustrated in the cross-sectional view in FIG. 9, the structure of the image sensor according to the present embodiment is substantially the same as that of Embodiment 1. As already described, the large difference is that the TFT 302 for amplification has a staggered structure without a bottom gate while the TFT 303 has an inversely staggered structure with a bottom gate.

The image sensor according to the present embodiment can drive the detection circuit illustrated in FIG. 4 by connecting it to the respective signal lines. At this time, the image sensor according to the present embodiment can employ a similar driving method to that of Embodiment 1 illustrated in the timing chart in FIG. 6.

The image sensor according to the present embodiment enables high resolution, high-speed operation and a high SN ratio. Furthermore, the image sensor can provide high yield without causing the characteristics deterioration of the oxide semiconductor TFT though it has a structure in which the PD is laminated above the oxide semiconductor film TFT. The reason is described below.

The reason why the image sensor according to the present embodiment enables high speed operation is similar to that of Embodiment 1. The image sensor according to the present embodiment includes a gas barrier film between the TFT and the PD similarly to Embodiment 1, and the gas barrier film is not provided with a contact hole in a pixel. Thus, from a reason similar to Embodiment 1, high yield can be provided. The reason why it provides high resolution is similar to that of Embodiment 1.

The reason why the image sensor according to the present embodiment provides a high SN ratio is that the gain of the amplifier circuit that is composed of the TFT 302 and the detection circuit can be kept high. The following describes the reason in detail.

For the image sensor according to the present embodiment, the TFT 302 for amplification has a staggered structure and has no bottom gate. Accordingly, the current flowing between the source and the drain of the TFT 302 is controlled by the voltage of the lower electrode of the PD functioning as a back gate, that is, the cathode voltage of the PD. Thus, the drain current of the TFT 302 is closely related as follows.

$$Id = \frac{1}{2}\frac{W}{L}\mu_0 C_0 (V_{Kgs} - V_{th})^2 \tag{7}$$

Here, W and L represent the channel width and the channel length of the TFT, respectively. $\mu_0$ represents field effect mobility. Co represents the capacitance per unit area between the oxide semiconductor film and the top gate in the TFT. $V_{th}$ represents the threshold voltage of the TFT. $V_{Kgs}$ represents the back gate voltage with respect to the source terminal of the TFT. The voltage of the signal line Dm when the detection circuit illustrated in FIG. 4 is connected to the signal line Dm is evaluated by using this appropriate expression as follows.

$$V_{dm} = V_C - \left( \sqrt{\frac{2LI_{ref}}{\mu_0 C_0 W}} + V_{th} \right) \quad (8)$$

The coefficient of Vc, which is a signal voltage, is 1, and thus a high gain can be achieved. As a result, a high SN ratio can be provided. The difference between the present embodiment and Embodiment 1 is described. In Embodiment 1, by applying the voltage of the source terminal of the TFT to the bottom gate, the current flowing through the TFT for amplification is less affected by the bottom gate voltage. In contrast thereto, in the present embodiment, the TFT for amplification is originally structured so as not to have a bottom gate and whereby, the current flowing through the TFT can be controlled by only the back gate. This does not cause an effect similar to the substrate bias effect that is found in the transistor formed on crystalline silicon. As a result, high gain may be provided as an amplifying circuit.

Here, the reason why the staggered structure is not applied to the TFT 303 is as follows. The TFT 303 is required to have low ON resistance. However, in the case of the TFT with the staggered structure, laminating a thin insulator film with high film quality on the oxide semiconductor film is difficult. The TFT 303 with the staggered structure cannot provide sufficient characteristics. Thus, by applying to the TFT 303 the inversely staggered structure that allows a thin insulator film with high film quality to be formed, low ON resistance may be provided.

(Manufacturing Method 1)

One example of the manufacturing method of the image sensor according to Embodiment 1 is described in detail with reference to drawings.

Figure 10A:
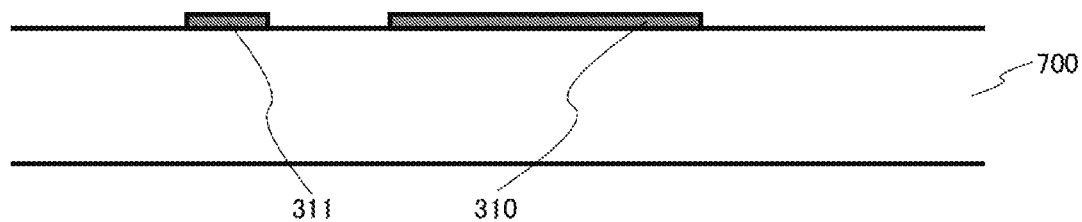
FIGS. 10A, 10B and 10C are cross-sectional views illustrating one example of a method for manufacturing the image sensor according to Embodiment 1.
Figure 11A:
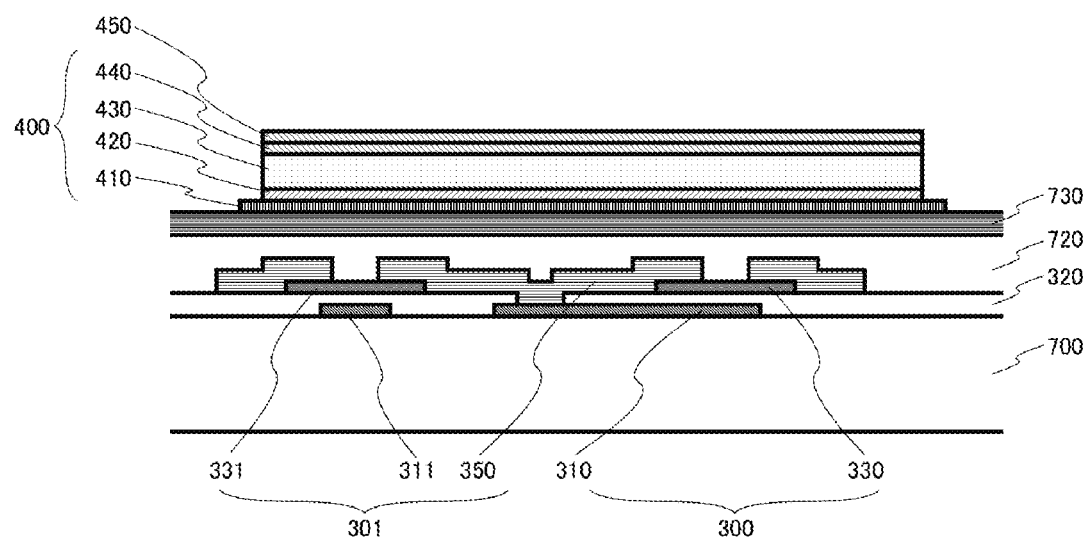
FIGS. 11A and 11B are cross-sectional views illustrating one example of a method for manufacturing the image sensor according to Embodiment 1.
Figure 11B:
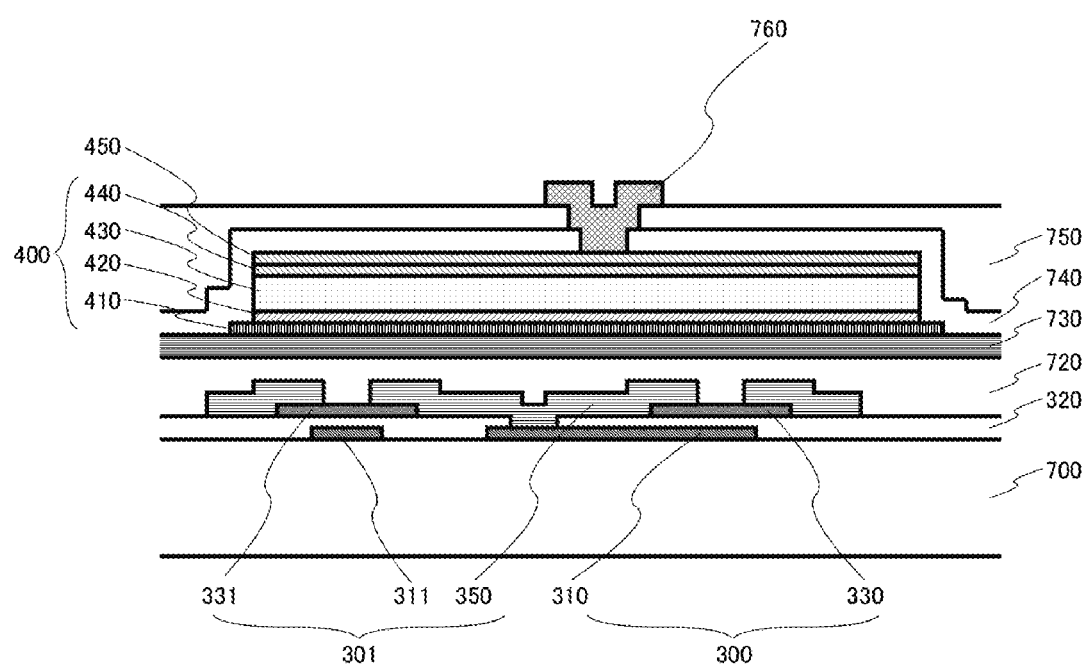

10A, 10B and 10C are cross-sectional views illustrating one example of a method for manufacturing the image sensor according to Embodiment 1. FIGS. 11A and 11B are cross-sectional views illustrating one example of a method for manufacturing the image sensor according to Embodiment 1. FIG. 10A is a cross-sectional view illustrating a process before and when metal that forms the gate electrodes 310 and 311 functioning as the bottom gates is deposited and patterned on the substrate 700. The substrate 700 can be made of an insulated substrate such as a glass substrate, a resin substrate, or a substrate made by coating metal with an insulator film or the like. The metal that forms the gate electrode can employ metal such as Al, Cr, Cu or the like or an alloy thereof.

Figure 10B:
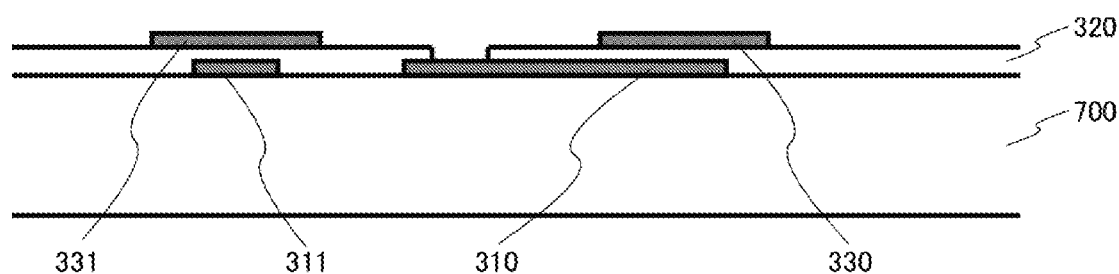

Then, as illustrated in FIG. 10B, the gate insulating film 320 is laminated, and the oxide semiconductor films 330 and 331 are laminated and patterned. The gate insulating film may be made of a silicon oxide film, a silicon nitride film, a silicon nitride oxide film, or a laminated film thereof. The oxide semiconductor film may employ an oxide semiconductor film including In, Ga and Zn. Next, a contact hole for electrically connecting a source and drain metal to be laminated next and the gate metal is formed.

Figure 10C:
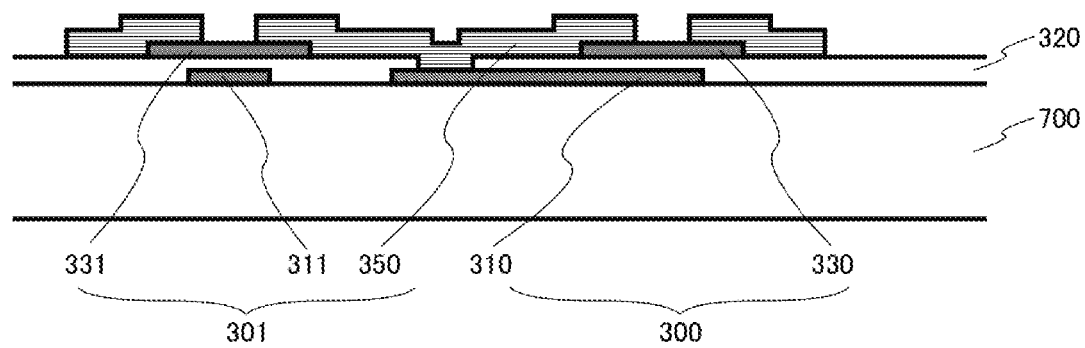

Then, the source and drain metal 350 is laminated and patterned as illustrated in FIG. 10C. The source and drain metal can be made of metal such as Al, Cr, Cu or the like or an alloy thereof. Furthermore, a silicon oxide film may be laminated and patterned between the oxide semiconductor film functioning as a channel region of the TFT and the source and drain metal. The silicon oxide film functions as a channel protective film. The structure employing a channel protective film has an effect of preventing the channel region of the oxide semiconductor film from being damaged due to an etching solution or the like at the time of patterning of the source and drain metal.

Successively, the interlayer film 720 and the gas barrier film 730 are laminated as illustrated in FIG. 11A. The interlayer film 720 may employ a silicon oxide film. The gas barrier film can be made of p-xylene polymer, acrylic resin, or the like. The interlayer film and the gas barrier film are desirably made as thin as possible to the extent that hydrogen is prevented from diffusing to the TFT. Then, metal functioning as the lower electrode 410 of the PD 400 is laminated on the gas barrier film, and the n-a-Si 420, the i-a-Si 430 and a p-a-Si 440 are continuously deposited thereon. A transparent electrode functioning as the upper electrode 450 is deposited thereon. Then, they are patterned. The lower electrode 410 can be made of Al, Cr or the like. The upper electrode 450 can employ an oxide conductive film such as ITO and IZO.

Successively, as illustrated in FIG. 11B, the protective film 740 for protecting the sides of the PD and the passivation film 750 are laminated. Furthermore, a contact hole is formed as necessary, and then, a wiring metal film 760 is laminated and patterned. The protective film 740 can employ a silicon nitride film, a silicon nitride oxide film or the like. The passivation film can employ a silicon oxide film, a silicon nitride film, a silicon nitride oxide film, acrylic resin or the like. The wiring metal film can employ a metal film made of Al, Cu or the like. Thereafter, a flattening film and a scintillator are laminated although not illustrated to produce the image sensor.

(Manufacturing Method 2)

Figure 12A:
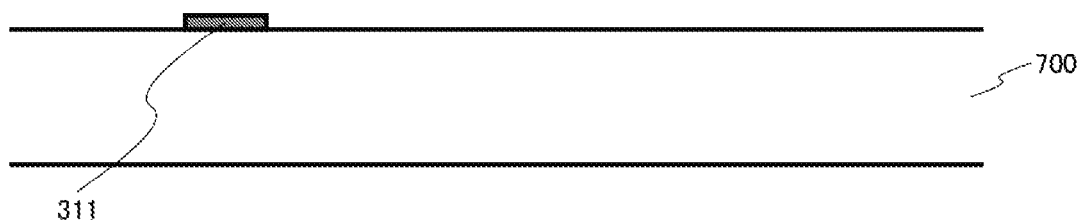
FIGS. 12A, 12B and 12C are cross-sectional views illustrating one example of a method for manufacturing an image sensor according to Embodiment 2.
Figure 12B:
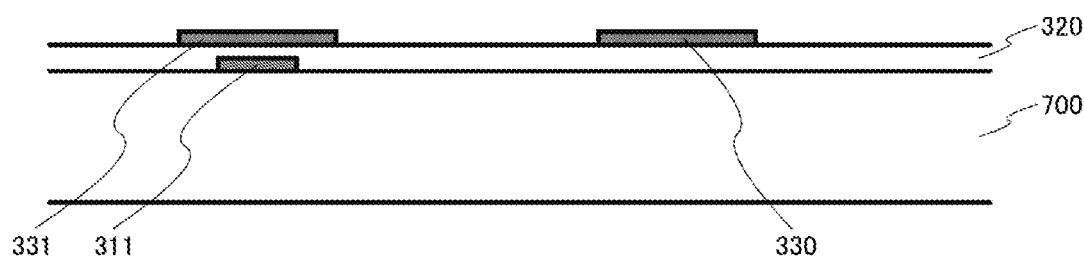
Figure 12C:
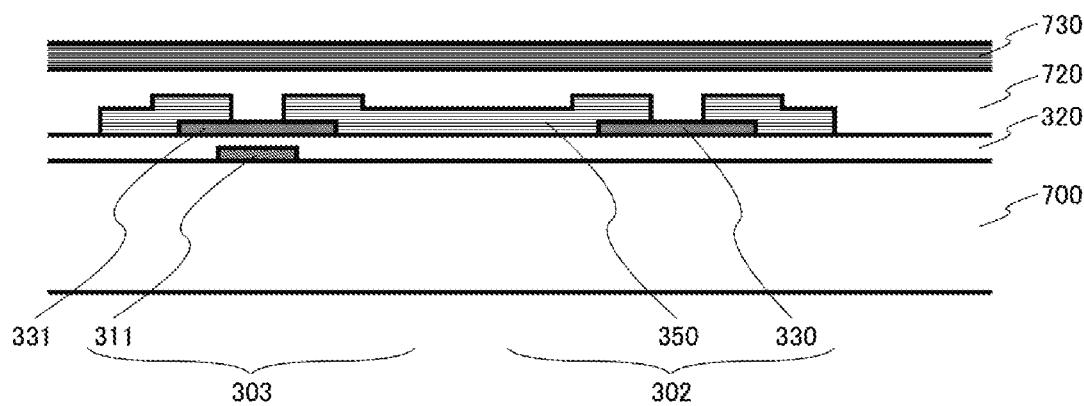

One example of the manufacturing method of the image sensor according to Embodiment 2 is described in detail with reference to drawings. FIGS. 12A, 12B and 12C are cross-sectional views illustrating one example of a method for manufacturing an image sensor according to Embodiment 2. The image sensor according to Embodiment 2 can employ the same structure as that of Embodiment 1 except for the structure of the oxide semiconductor TFT. Thus, the description is merely made on the manufacturing method before and when the oxide semiconductor TFT is formed.

In the image sensor according to Embodiment 2, a metal film that forms the bottom gate 311 of the TFT 303 is deposited and patterned on the substrate 700 as illustrated in FIG. 12A. Meanwhile, no metal film that forms the bottom gate is arranged at the position of the substrate above which the TFT 302 is to be formed. The substrate can employ a substrate made by coating metal with an insulator film or the like other than an insulated substrate such as a glass substrate and a resin substrate. The metal film that forms the bottom gate can employ a metal film such as Al, Cr, Cu or the like or an alloy thereof.

Successively, as illustrated in FIG. 12B, the gate insulating film 320 is laminated, and the oxide semiconductor films 330 and 331 are laminated and patterned. The gate insulating film may employ a silicon oxide film, a silicon nitride film, a silicon nitride oxide film, or a laminated film thereof. The oxide semiconductor film can employ an oxide semiconductor film containing In, Ga and Zn.

Next, as illustrated in FIG. 12C, the source and drain metal 350 is laminated and patterned, and the interlayer film 720 and the gas barrier film 730 are laminated thereon. The source and drain metal can employ metal such as Al, Cr, Cu or the like, or an alloy thereof. The interlayer film 720 can employ a silicon oxide film. The gas barrier film can be made of p-xylene polymer, acrylic resin, or the like. Then, the PD is formed. The same method as the above described one can be applied to the manufacturing method of the PD.

The image sensor according to the present embodiment includes a plurality of pixels arranged in matrix. Each pixel includes a substrate, a first TFT, a second TFT and a photoelectric conversion element. A gas barrier film that is positioned between the first and second TFTs and the photoelectric conversion element and that prevents hydrogen from permeating into the first and second TFTs is provided. A first electrode and a first gate electrode are constructed by the same layer. In each pixel, no aperture is provided on the gas barrier film. The first TFT is the TFT 302, for example. The second TFT is the TFT 303, for example. The photoelectric conversion element is the PD 401, for example. The first electrode is the lower electrode 410, for example. The first gate electrode is the lower electrode 410 of the PD 401 functioning as a gate electrode of the TFT 302, for example. The gas barrier film is the gas barrier film 730, for example.

The first TFT comprises a first semiconductor including an oxide semiconductor laminated above the substrate via an insulator film, a first source electrode and a first drain electrode that are laminated on the first semiconductor, and a first gate electrode arranged above the first semiconductor. The first drain electrode is electrically connected to a power line. The first semiconductor is the oxide semiconductor film 330, for example. The first source electrode and the first drain electrode are parts of the metal 350, for example.

The second TFT comprises a second gate electrode arranged on the substrate, a second semiconductor including an oxide semiconductor laminated above the second gate electrode via the insulator film and an oxide semiconductor constructed by the same layer of the first semiconductor, a second source electrode and a second drain electrode that are laminated on the second semiconductor. The second drain electrode is electrically connected to the first source electrode, the second source electrode is electrically connected to a signal line, and the second gate electrode is electrically connected to a first control line. The second semiconductor is the oxide semiconductor film 331, for example. The second source electrode and the second drain electrode are parts of the source and drain metal 350, for example. The second gate electrode is the gate electrode 311, for example.

The photoelectric conversion element includes a-Si thin film, a first electrode electrically connected to a first surface of the a-Si thin film and a first gate electrode of the first TFT, and a second electrode connected to a second control line, and the photoelectric conversion element is arranged above the first TFT so as to be superposed on the first TFT in a laminated direction. The a-Si thin film is the n-a-Si 420, the i-a-Si 430 and the p-a-Si 440, for example. The second electrode is the upper electrode 450, for example.

The image sensor according to the present embodiment includes a gas barrier film that is positioned between the first and second TFTs and the photoelectric conversion element and that prevents hydrogen from diffusing to the first and second TFTs. The gas barrier film is the gas barrier film 730, for example.

In the image sensor according to the present embodiment, the first electrode and the first gate electrode are constructed by the same layer, and the gas barrier film is not provided with an aperture in each of the pixels.

In the image sensor according to the present embodiment, the first electrode and the first gate electrode are laminated on the gas barrier film.

In the image sensor according to the present embodiment, the first electrode and the first gate electrode are superposed on the first semiconductor, the first source electrode, the second drain electrode and the second semiconductor in a laminated direction.

In the image sensor according to the present embodiment, the first electrode and the first gate electrode are arranged on an interlayer insulating film that is laminated on the first semiconductor, the first source electrode, the second drain electrode and the second semiconductor.

In the image sensor according to the present embodiment, the second electrode of the photoelectric conversion element is laminated on a second surface of the a-Si thin film opposed to the first surface.

In the image sensor according to the present embodiment, the photoelectric conversion element is a photodiode, the first electrode is a cathode terminal, and the second electrode is an anode terminal.

In the image sensor according to the present embodiment, the photoelectric conversion element is a photodiode, the first electrode may be an anode terminal, and the second electrode may be a cathode terminal.

Embodiment 3

Figure 13:
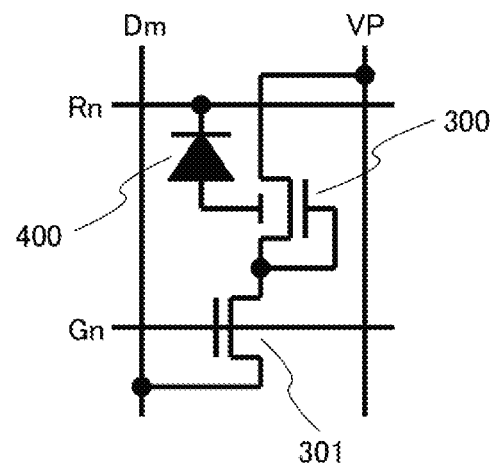
FIG. 13 is a circuit diagram illustrating another example of a configuration of a one-pixel circuit.

The image sensor in Embodiment 1 described above has a circuit configuration in which the cathode terminal of the PD is connected to the gate of the TFT. Another embodiment may employ a circuit configuration in which the anode terminal of the PD is connected to the gate of the TFT. FIG. 13 is a circuit diagram illustrating another example of a configuration of a one-pixel circuit. FIG. 13 illustrates a circuit configuration of the image sensor according to Embodiment 1 in which the anode terminal of the PD is connected to the gate of the TFT. In this circuit configuration, the same driving method as that described in Embodiment 1 can be applied except for resetting of the PD by applying negative pulses to the reset line. The produced effect is also similar to that of Embodiment 1.

Embodiment 4

Figure 14:
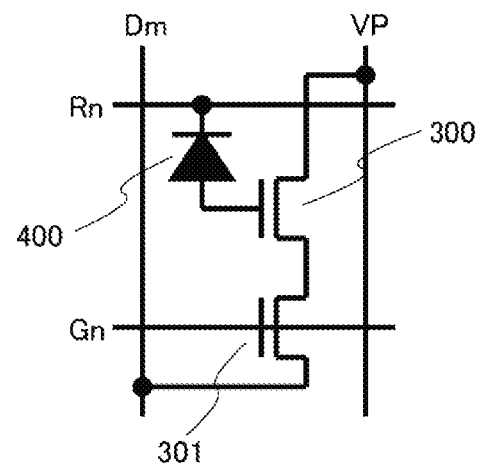
FIG. 14 is a circuit diagram illustrating another example of a configuration of a one-pixel circuit.

Similarly to Embodiment 3, Embodiment 2 may be changed to have a circuit configuration in which the anode terminal of the PD is connected to the gate of the TFT. FIG. 14 is a circuit diagram illustrating another example of a configuration of a one-pixel circuit. FIG. 14 illustrates a circuit configuration of the image sensor according to Embodiment 2 in which the anode terminal of the PD is connected to the gated of the TFT. In this circuit configuration, the same driving method as that described in Embodiment 2 can be applied except for resetting of the PD by applying negative pulses to the reset line. The produced effect is also similar to that of Embodiment 2.

Modified Example 1

Figure 15:
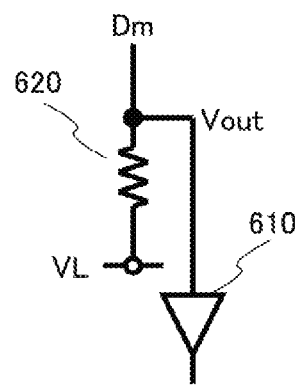
FIG. 15 is a circuit diagram illustrating another example of a configuration of the detection circuit.

In the above-described image sensor, a configuration of the detection circuit other than that illustrated in FIG. 4 can be applied. FIG. 15 is a circuit diagram illustrating another example of a configuration of the detection circuit. The detection circuit includes a voltage amplification circuit 610 and a resistor 620. The detection circuit having the configuration as illustrated in FIG. 15 can be operated in a similar method to the detection circuit illustrated in FIG. 4.

Modified Example 2

Figure 16:
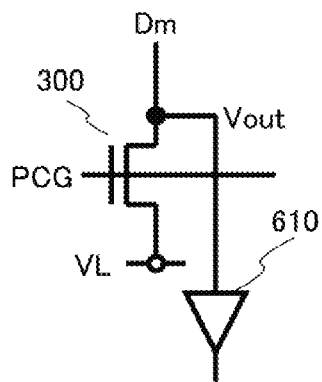
FIG. 16 is a circuit diagram illustrating another example of a configuration of the detection circuit.
Figure 17:
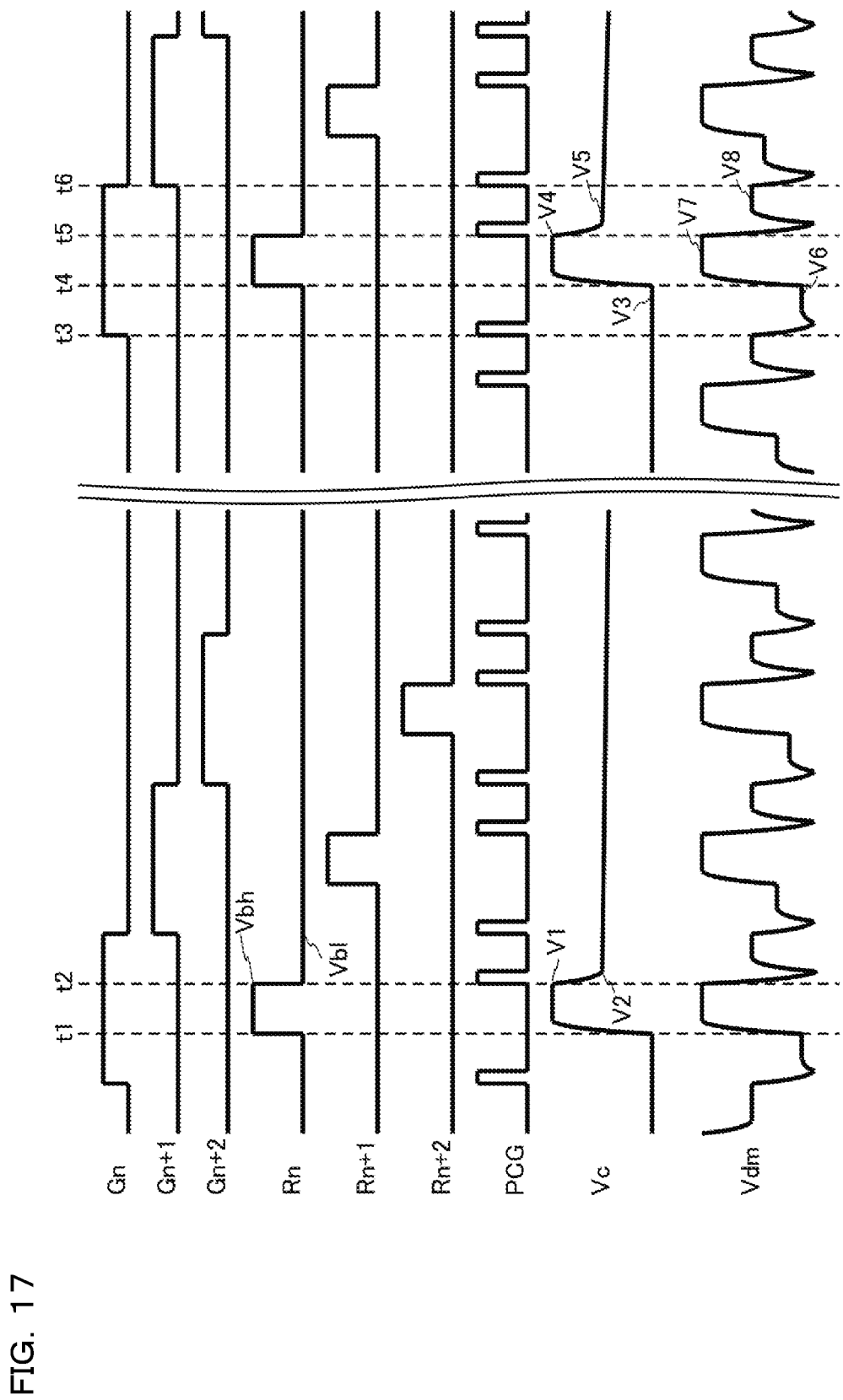
FIG. 17 is a timing chart illustrating operation of the detection circuit illustrated in FIG. 16.
Figure 18:
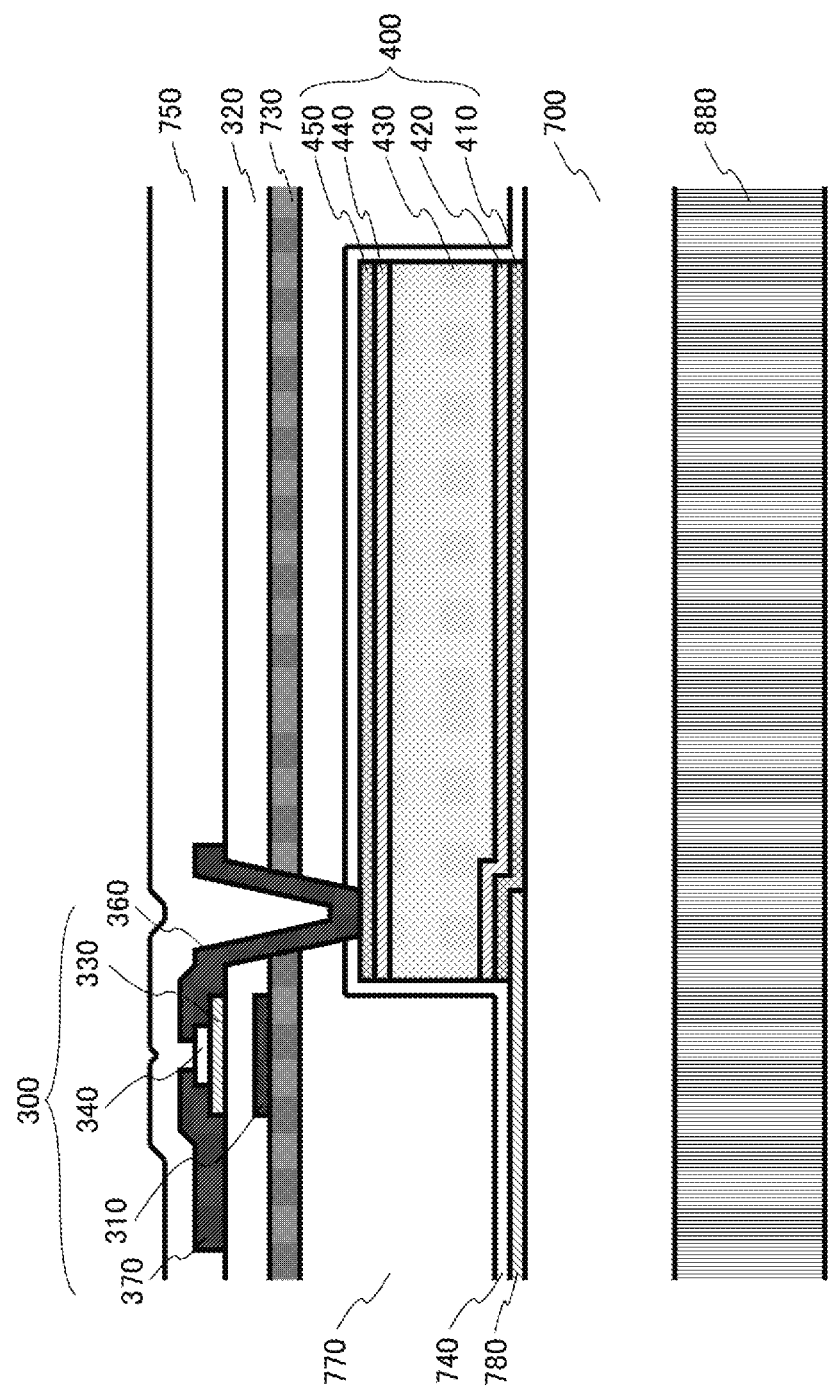
FIG. 18 is a cross-sectional view illustrating a configuration of an image sensor disclosed in Japanese Patent Application Laid-Open No. 2015-90957.

FIG. 16 is a circuit diagram illustrating another example of a configuration of the detection circuit. FIG. 17 is a timing chart illustrating operation of the detection circuit illustrated in FIG. 16. In FIG. 17, a signal PCG is a pulse signal for resetting the signal line Dm to low potential. By the PCG, the signal line Dm is reset to low potential immediately after time t3 and immediately after time t5. Time t3 is a starting point of a period (from time t3 to t4) during which the voltage depending on the amount of light by which the PD is irradiated is read out. Time t5 is a starting point of a period (from time t5 to t6) during which voltage after reset is read out. The reason why the signal line Dm is reset to low potential is as follows. The TFTs 300 and 302 for amplification of the pixels can flow current only in a direction in which the potential of the signal line is increased, and thus, the signal line needs to be pre-charged to low potential immediately before reading out of signals. In addition, in the circuits illustrated in FIG. 4 and FIG. 15, the current source 600 or the resistor 620 can flow current in a direction in which the potential of the signal line is reduced, and thus, the pre-charging operation described above is not necessary.

At the present time, semi-conducting materials to form a p-channel-type TFT having enough characteristics as the oxide semiconductor TFT have not been found. Thus, the oxide semiconductor TFT employing an n-channel-type TFT is exemplified in the Embodiments. However, in the case that a p-channel-type TFT with enough characteristics is achieved in the future, the p-channel-type TFT will be able to be applied to the image sensor of the present disclosure. In this case, by changing the polarity of the control signal for controlling the TFT and the polarity of the power supply, the present disclosure is adaptable to the p-channel-type TFT.

Lastly, the outstanding features of the image sensor according to Embodiments 1-4 (including Modified examples 1 and 2) are summarized. In the image sensors according to Embodiments 1-4, the PD made of a-Si is laminated above the oxide semiconductor TFT. In addition, the gas barrier film for preventing hydrogen from diffusing is arranged between the oxide semiconductor TFT and the PD. No contact hole is formed on the gas barrier film at the pixel region. This makes it possible to prevent hydrogen contained in raw material gas upon forming a PD from diffusing to the oxide semiconductor TFT and to reduce the characteristics fluctuation of the oxide semiconductor TFT significantly.

In the case where the inversely staggered structure is employed for the TFT for amplification like Embodiment 1 or the like, by applying the source potential of the TFT to the bottom gate, the gain of the amplifier circuit is prevented from decreasing. In Embodiment 2 or the like, employing the staggered structure for the TFT for amplification achieves a circuit without reduction of the gain of the amplifier circuit, and employing the inversely staggered structure for the TFT for selecting individual pixels achieves low ON resistance.

The technical features (components) described in the respective embodiments can be combined with each other, and by the combination, a new technical feature can be created. It is to be understood that the embodiments herein disclosed are illustrative in all respects and not restrictive. The scope of the present disclosure is defined by the appended claims rather than by the description preceding them, and all changes that fall within the meanings and the bounds of the claims, or equivalence of such meanings and bounds are intended to be embraced by the claims.

What is claimed is:

1. An image sensor including a plurality of pixels, each pixel of the plurality of pixels comprising:
   a substrate;
   a first TFT (thin film transistor) comprising a first gate electrode, and a first semiconductor including an oxide semiconductor layer laminated above the first gate electrode via an insulator film, a first source electrode and a first drain electrode that are laminated on the first semiconductor;
   a second TFT comprising a second gate electrode, a second semiconductor including an oxide semiconductor layer laminated above the second gate electrode via the insulator film, and a second source electrode and a second drain electrode that are laminated on the second semiconductor; and
   a photoelectric conversion element comprising an a-Si (amorphous silicon) thin film, a first electrode disposed in contact with a substrate-side surface of the a-Si thin film, and a second electrode disposed in contact with a surface of the a-Si thin film opposite to the substrate-side,
   wherein the plurality of pixels arranged vertically and horizontally on the substrate, wherein
   the first source electrode is electrically connected to the first gate electrode, the first drain electrode is electrically connected to a power line, the second drain electrode is electrically connected to the first gate electrode, the second source electrode is electrically connected to a signal line, the gate electrode is electrically connected to a first control line, and the second electrode is electrically connected to a second control line,
   the first electrode is disposed on a channel region located between the first source electrode and the first drain electrode of the first TFT via a gas barrier film and an interlayer film, a-the gas barrier film diffusion of hydrogen and
   the gas barrier film is not provided with an aperture in an area of each of the pixels.

2. The image sensor according to claim 1, wherein the first source electrode and the second drain electrode are made of a same metal layer, and the first source electrode is connected to the first gate electrode through a contact hole provided on the insulator film.

3. The image sensor according to claim 1, wherein the first electrode is laminated on the gas barrier film.

4. The image sensor according to claim 1, wherein the second electrode of the photoelectric conversion element is laminated on a second surface of the a-Si thin film opposed to the first surface.

5. The image sensor according to claim 1, wherein the photoelectric conversion element is a photodiode, the first electrode is a cathode terminal, and the second electrode is an anode terminal.

6. The image sensor according to claim 1, wherein the photoelectric conversion element is a photodiode, the first electrode is an anode terminal, and the second electrode is a cathode terminal.

7. A sensor device comprising:
   the image sensor according to claim 1; and
   a control circuit including a power output terminal configured to output power to the power line, a first control output terminal configured to output a first control signal to the first control line, a second control output terminal configured to output a second control signal to the second control line, and an input terminal to which potential output from the second source electrode of the second TFT is to be input via the signal line, wherein the control circuit is configured to:

classify an operating period of the image sensor as a read-out period and an accumulation period, during the read-out period, perform a first observing operation of changing, from a first level voltage to a second level voltage, the first level being lower than the second level voltage, a first control signal that is output from the first control output terminal and that is applied to the second gate electrode of the second TFT via the first control line, and of observing potential of an input signal that is output from the second source electrode and that is applied to the input terminal via the signal line, operate a reset operation of, after the first observing operation, changing, from the first level voltage to the second level voltage, the second control signal that is output from the second control output terminal and that is applied to the second electrode of the photoelectric conversion element via the second control line, and then restoring the second control signal to the first level voltage again and perform a second observing operation of observing potential of the input signal and restoring the second control signal to the first level voltage after the reset operation, output differential potential between potential observed by the first observing operation and potential observed by the second observing operation, retain, during the accumulation period, the first control signal and the second control signal at the first level voltage, and perform operation of accumulating signal charges by light in the photoelectric conversion element, and alternately perform operation during the read-out period and operation during the accumulation period.

8. An image sensor including a plurality of pixels, each pixel of the plurality of pixels comprising:
a substrate;
a first TFT (thin film transistor) comprising a first semiconductor including an oxide semiconductor layer laminated above an insulator film, and a first source electrode and a first drain electrode that are laminated on the first semiconductor;
a second TFT comprising a first gate electrode, a second semiconductor including an oxide semiconductor laminated above the first gate electrode via the insulator film, and a second source electrode and a second drain electrode that are laminated on the second semiconductor; and
a photoelectric conversion element comprising an a-Si (amorphous silicon) thin film, a first electrode disposed in contact with a substrate-side surface of the a-Si thin film, and a second electrode disposed in contact with a surface of the a-Si thin film opposite to the substrate-side,
wherein the plurality of pixels are arranged vertically and horizontally on the substrate: wherein
the first source electrode is electrically connected to the second drain electrode, the first drain electrode is electrically connected to a power line, the second source electrode is electrically connected to a signal line, the first gate electrode is electrically connected to a first control line, and the second electrode is electrically connected to a second control line,
the first electrode is disposed on a channel region located between the first source electrode and the first drain electrode of the first TFT via a gas barrier film and an interlayer film,
the gas barrier film being configured to suppress diffusion of hydrogen and the gas barrier film is not provided with an aperture in an area of each of the pixels of the plurality of pixels.

9. The image sensor according to claim 8, wherein the first electrode is laminated on the gas barrier film.

10. The image sensor according to claim 8, wherein the first electrode is superposed on the first semiconductor, the first source electrode, and the second drain electrode in a laminated direction.

11. The image sensor according to claim 8, wherein the first electrode is arranged on an interlayer insulating film that is laminated above the first semiconductor, the first source electrode, and the second drain electrode.

12. A sensor device comprising:
the image sensor according to claim 8; and
a control circuit including a power output terminal configured to output power to the power line, a first control output terminal configured to output a first control signal to the first control line, a second control output terminal configured to output a second control signal to the second control line, and an input terminal to which potential output from the second source electrode of the second TFT is to be input via the signal line, wherein
the control circuit is configured to:
classify an operating period of the image sensor as a read-out period and an accumulation period,
during the read-out period, perform a first observing operation of changing, from a first level voltage to a second level voltage, the first level being lower than the second level, a first control signal that is output from the first control output terminal and that is applied to the first gate electrode of the second TFT via the first control line, and of observing potential of an input signal that is output from the second source electrode and that is applied to the input terminal via the signal line,
operate a reset operation of, after the first observing operation, changing, from the first level voltage to the second level voltage, the second control signal that is output from the second control output terminal and that is applied to the second electrode of the photoelectric conversion element via the second control line, and then restoring the second control signal to the first level voltage again
operate a second observing operation of observing potential of the input signal and restoring the second control signal to the first level voltage after the reset operation,
output differential potential between potential observed by the first observing operation and potential observed by the second observing operation,
retain, during the accumulation period, the first control signal and the second control signal at the first voltage, and perform operation of accumulating signal charges by light in the photoelectric conversion element, and
alternately perform operation during the read-out period and operation during the accumulation period.

* * * * *